United States Patent
Dohle et al.

(10) Patent No.: US 6,674,775 B1
(45) Date of Patent: Jan. 6, 2004

(54) CONTACT STRUCTURE FOR SEMICONDUCTOR LASERS

(75) Inventors: Gottfried Rainer Dohle, San Jose, CA (US); Vincent V. Wong, San Jose, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/507,598

(22) Filed: Feb. 18, 2000

(51) Int. Cl.⁷ .............................................. H01S 5/00
(52) U.S. Cl. ..................................................... 372/38.05
(58) Field of Search ..................................... 372/38.05

(56) References Cited

U.S. PATENT DOCUMENTS

| | | | |
|---|---|---|---|
| 4,879,588 A | 11/1989 | Ohtsuka | 257/664 |
| 4,879,589 A | 11/1989 | Saint-Cyr | 257/703 |
| 5,100,740 A | 3/1992 | Neugebauer et al. | 428/622 |
| 5,299,214 A | 3/1994 | Nakamura et al. | 372/36 |
| 5,350,662 A | 9/1994 | Chi | 430/313 |
| 5,432,808 A * | 7/1995 | Hatano et al. | 372/45 |
| 5,665,473 A | 9/1997 | Okoshi et al. | 428/457 |
| 5,773,879 A | 6/1998 | Fusayasu et al. | 257/678 |
| 5,812,570 A | 9/1998 | Spaeth et al. | 372/36 |
| 5,835,518 A * | 11/1998 | Mundinger et al. | 372/50 |
| 5,848,083 A | 12/1998 | Haden et al. | 372/36 |
| 5,880,705 A | 3/1999 | Onyskevych et al. | 345/80 |
| 5,913,108 A | 6/1999 | Stephens et al. | 438/109 |
| 5,923,692 A | 7/1999 | Staskus et al. | 372/50 |
| 5,942,796 A | 8/1999 | Mosser et al. | 257/712 |
| 5,943,553 A | 8/1999 | Spaeth et al. | 438/29 |
| 5,977,625 A | 11/1999 | Edwards et al. | 257/704 |
| 5,981,310 A | 11/1999 | DiGiacomo et al. | 438/106 |
| 5,981,945 A | 11/1999 | Spaeth et al. | 250/239 |
| 6,014,317 A | 1/2000 | Sylvester et al. | 361/760 |
| 6,016,007 A | 1/2000 | Sanger et al. | 257/714 |
| 6,020,637 A | 2/2000 | Karnezos | 257/738 |
| 6,084,895 A * | 7/2000 | Kouchi et al. | 372/36 |
| 6,262,489 B1 * | 7/2001 | Koors et al. | 257/784 |

OTHER PUBLICATIONS

David R. Lide, Handbook of Chemistry and Physics, CRC, 82$^{nd}$ edition, p. 12–232.*

* cited by examiner

*Primary Examiner*—Paul Ip
*Assistant Examiner*—Jeffrey N Zahn
(74) *Attorney, Agent, or Firm*—David N. Lathrop, Esq.; Gallagher & Lathrop

(57) ABSTRACT

An improved electrical contact structure can be manufactured by plating a component of a first material such as molybdenum with a second material such as copper or silver. The first and second materials are selected to provide a desired effective coefficient of thermal expansion (CTE) and electrical conductivity. The contact structure can be made very thin for implementations in which multiple lasers are to be stacked closely together. The manufacturing processing can be carried out very inexpensively by first etching the outline of multiple components in a sheet of the first material and then plating the etched sheet with the second material.

8 Claims, 3 Drawing Sheets

CONTACT STRUCTURE FOR SEMICONDUCTOR LASERS

GOVERNMENT LICENSE RIGHTS

The present invention was made with U.S. Government support under Contract No. 70NANB5H1150 through the National. Institute of Standards Technology, Advanced Technology Program. The U.S. government has certain rights in the present invention.

TECHNICAL FIELD

The present invention pertains generally to contact structures affixed to semiconductor lasers, and pertains more particularly to improved contact structures and methods of their manufacture that are inexpensive.

BACKGROUND ART

The efficient operation of semiconductor laser devices, especially laser devices that operate at high power levels, require electrical contacts that have several properties. The first property is low electrical resistance, which improves efficiency by minimizing resistive power losses in the electrical contacts and which improves operational characteristics of the laser by minimizing the amount of heating caused by these resistive power losses. The second property is a coefficient of thermal expansion (CTE) that closely matches the CTE of the semiconductor laser material, which improves reliability by reducing mechanical strain in the laser and in the bond between laser and contact caused by differing amounts of thermal expansion. Problems caused by CTE mismatch are especially troublesome for semiconductor laser bars having one or more dimensions on the order of a centimeter (cm).

In applications that assemble multiple P-N junction semiconductor lasers into a single laser module, it is often desirable to make both the P-side and the N-side electrical contacts as thin as possible so that the lasers can be stacked next to each other as closely as possible. The degree to which the thickness of these contacts can be reduced is restricted by the cooling requirements of the laser module. In many implementations, the heat generated by a P-N junction laser is confined mostly to the P-side of the laser. As a result, the P-side electrical contact should also have high thermal conductivity. This particular property is not as important to the N-side electrical contact in these implementations; therefore, another property for at least an N-side contact is that it can be made very thin. Of course, in implementations that have other heat-generating characteristics, thermal conductivity requirements imposed on the P-side and N-side contacts will differ.

Yet another property for an electrical contact is that it can be manufactured very inexpensively. This requires that the contact be made of materials that are themselves inexpensive to acquire, and that the manufacturing process used to make the contacts be inexpensive to carry out.

Unfortunately, no known electrical contact structure satisfies all of these properties simultaneously.

DISCLOSURE OF INVENTION

It is an object of the present invention to provide for an electrical contact structure that can closely match the coefficient of thermal expansion of a semiconductor laser, can have very low electrical resistance, can be made very thin, and can be made very inexpensively having dimensions with low tolerances.

According to one aspect of the present invention, a laser module comprises a PN-junction semiconductor laser having a coefficient of thermal expansion (CTE) and having a P side and an N side. The laser module also includes a contact structure affixed to a surface of the semiconductor laser, where the contact structure comprises a first component comprised of a first material having a first coefficient of thermal expansion (CTE); and a second component comprised of a second material having a second CTE plated on opposing surfaces of the first component. The first and second components have an overall thickness such that the contact structure has an effective CTE that matches the CTE of the semiconductor laser more closely than either the first CTE or the second CTE. The layers of the second material are of substantially equal thickness to balance thermal stresses between the first component and the second component The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Laser Subassemblies

Figure 1A:
FIGS. 1A to 1C are schematic illustrations of semiconductor laser subassemblies in which a semiconductor laser is affixed to electrical contact structures.

FIG. 1A is a schematic illustration of laser subassembly 1 comprising semiconductor laser 11 affixed to electrical contacts 21 and 31. The relative dimensions of the laser subassembly shown in this as well as in other figures are not intended to be significant; however, the present invention may be used advantageously with laser diodes formed in the shape of a bar having at least one dimension that is on the order of a centimeter (cm).

The subassembly shown in FIG. 1A may be used in laser modules having circuits that carry electrical current to and from multiple locations along the lengths of electrical contacts 21 and 31. For example, the subassembly may be used in laser modules comprising multiple wires in parallel that are bonded to electrical contacts 21 or 31 at multiple points along the length of the contacts. Alternatively, the subassembly may be used in laser modules comprising large area terminals that are affixed to the surface of contacts 21 or 31.

In this first type of module, the electrical resistance of each contact is analogous to the composite resistance of a large number of paths connected in parallel. The resistance of each path is equal to the product of its respective length, which is the thickness of the contact, and its respective resistance per unit length, which depends on the conductive properties of the material from which the contact is made.

Figure 1B:

FIG. 1B is a schematic illustration of laser subassembly 2 that is very similar to laser subassembly 1 except electrical contacts 21 and 31 extend beyond the length of semiconductor laser 11. Laser subassembly 2 may be used in laser modules having circuits that carry current to and from the ends of the electrical contacts that extend beyond the end of semiconductor laser 11.

In this second type of module, the electrical resistance of each contact is analogous to a circuit that is much more complicated than the set of parallel paths discussed above because resistive losses in the contacts cause the current density through the laser diode to diminish along the length of each contact. This effect is undesirable because the unequal current density changes the operational characteristics of the laser diode along its length and reduces its expected lifespan. For this reason, it is especially important in the second type of laser modules to have electrical contacts with very low electrical resistance.

Figure 1C:
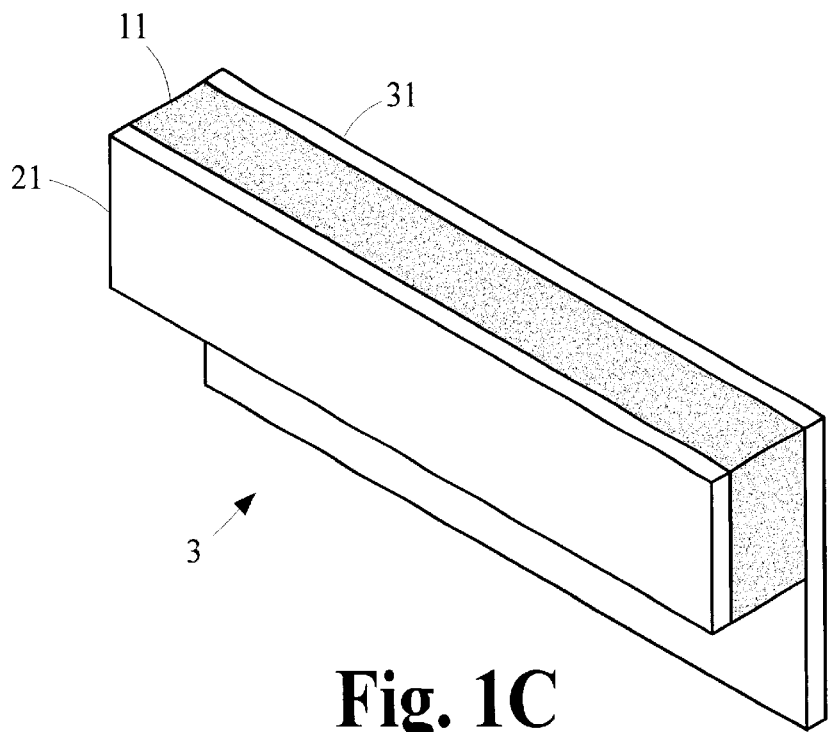
Figure 2:
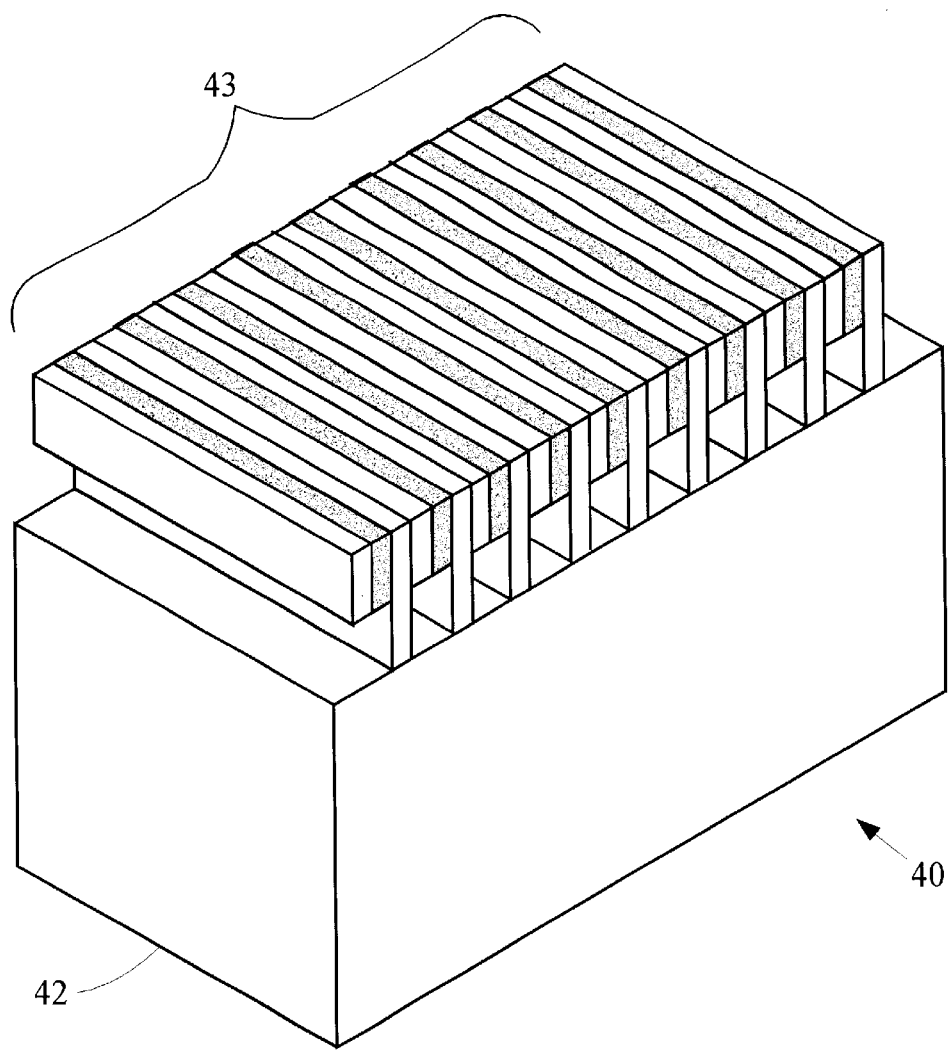
FIG. 2 is a schematic illustration of a laser module having a plurality of semiconductor laser subassemblies affixed to a common substrate.

The resistance of these electrical contacts is somewhat analogous to the composite resistance of a large number of paths connected in series. The resistance of each path is equal to the product of its length and the resistance per unit length, which depends on the conductive properties of the material from which the contact is made and upon the cross-sectional area of the contact. This will be discussed in more detail below. FIG. 1C is a schematic illustration of laser subassembly 3 that is very similar to laser subassembly I except electrical contact 21 extends beyond the width of semiconductor laser 11. This form of subassembly is suitable for use in laser modules comprising multiple subassemblies that are joined to one another in a stack, and which are affixed to a common substrate. Referring to FIG. 2, for example, laser module 40 comprises a stack 43 of laser subassemblies 3 that are affixed to substrate 42. The substrate may provide thermal cooling as well as structural support for the laser subassemblies.

The electrical contacts 21, 31 may be affixed to laser 11 by a wide variety of adhesive and bonding techniques including soldering. Generally, the use of a hard solder such as a gold-tin solder is preferred to provide a reliable bond between the laser and the contact.

B. Electrical Contact Structure

Figure 3:
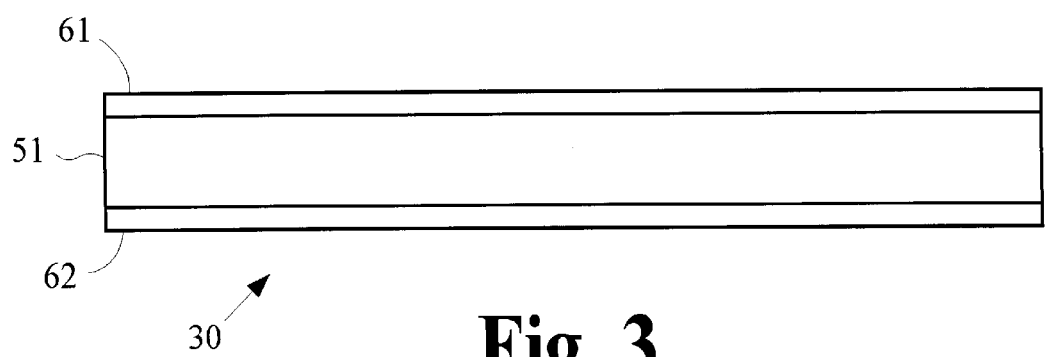
FIG. 3 is a schematic cross-sectional illustration of an electrical contact structure.

FIG. 3 is a schematic cross-sectional illustration of electrical contact structure 30 comprising component 51 of a first material having plated layers 61, 62 of a second material. The first and second materials, thickness of the component and thicknesses of the plated layers are all selected to provide a contact structure having desired properties including its coefficient of thermal expansion (CTE), electrical conductivity, and overall physical thickness. Thermal conductivity may also be taken into account.

An electrical contact structure for a gallium-arsenide (GaAs) semiconductor laser is illustrative. In this example, a GaAs laser has a CTE of about $6.5 \times 10^{-6}/°$ C. A contact structure may be formed from a component made of molybdenum (Mo) plated on opposite or all surfaces with copper (Cu). The Mo component has a length of about 1.8 cm, a width of about 0.15 cm, a thickness of about 0.0075 cm, and a CTE of about $5.1 \times 10^{-6}/°$ C. Each of the two plated Cu layers has a thickness of about 0.00125 cm, a length (1.8 cm) and a width (0.15 cm) equal to that of the Mo component, and a CTE of about $17 \times 10^{-6}/°$ C. The total thickness of the contact structure is 0.010 cm.

The effective CTE of this structure may be determined empirically, which closely approximates the CTE of the GaAs laser. The CTE of the contact structure may be increased or decreased by either increasing or decreasing the relative thickness of the plated Cu layers as compared to the thickness of the Mo component, respectively.

The effective CTE may also be estimated analytically from the formula $$\alpha_{EFF} = \frac{\sum_i \alpha_i E_i t_i}{\sum_i E_i t_i}$$

where $\alpha_{EFF}$=effective CTE of the structure;
$\alpha_i$=CTE of material in layer i;
$E_i$=elastic modulus of material in layer i; and
$t_i$=thickness of layer i.

More accurate solutions can be obtained using finite element modeling. Additional information for these two techniques may be obtained from Tummala, "Microelectronics Packaging Handbook," Chapman & Hall, 2nd ed., 1997, Part I, pp. 462–65 and 498, which is incorporated herein by reference.

The electrical resistance of each material in ohms may be calculated from the expression $$R = \rho \frac{l}{w \cdot t}$$

where $\rho$=resistive constant of each material in ohm-cm;
l=length of the material in cm;
w=width of the material in cm; and
t=thickness of the material in cm.

The resistive constant for Mo at 25° C. is $5.47 \times 10^{-6}$ ohm-cm; therefore, the end-to-end resistance of the Mo component is about $8.75 \times 10^{-3}$ ohms. The resistive constant for Cu at 25° C. is $1.71 \times 10^{-6}$ ohm-cm; therefore, the end-to-end resistance of each Cu layer is about $16.42 \times 10^{-3}$ ohms.

The end-to-end resistance of the contact structure may be obtained by calculating the effective resistance of these three layers in parallel. For this particular Cu/Mo/Cu contact structure, the end-to-end resistance is about $4.24 \times 10^{-3}$ ohms. Resistive power losses in this structure is a function of current, which may be calculated from the expression $$P = I^2 R$$

where P=resistive losses in watts;
I=current in amperes; and
R=resistance in ohms.

From this expression, it can be seen that the resistive power losses are 0.42 watts at 10 amperes and 42.4 watts at 100 amperes.

This particular example includes two plated Cu layers of equal thickness. In principle, only one plated layer or two plated layers of unequal thickness may be used. The relative thicknesses may be adjusted as necessary to provide the desired CTE and electrical resistance. Two layers of equal thickness are preferred, however, because this particular structure will have essentially no bending or bowing caused by unequal thermal expansion of the two materials. In other words, the stress imposed by one of the bi-metallic junctions on one surface of the structure will be cancelled by the stress imposed by the bimetallic junction on the opposite surface.

This electrical contact structure has the following desirable properties: (1) it has an effective CTE that closely matches the CTE of a GaAs laser; (2) it has a very low end-to-end electrical resistance, and (3) it is very thin.

Similar contact structures may be made for GaAs lasers using different materials. For example, a Mo component may be plated with silver (Ag) rather than Cu. Relative thicknesses of these two materials may be adjusted to match the effective CTE with the CTE of GaAs and to provide an electrical resistance that is sufficiently low. Generally, the two materials of the contact structure should be selected such that the CTE of the semiconductor laser is intermediate to the CTE of the two materials and the desired effective electrical resistive constant of the structure is intermediate to the electrical resistive constant of the two materials.

C. Manufacture

Another advantage provided by the electrical contact structure described above is that it can be manufactured very inexpensively by first etching the outline of the contact component in a thin sheet of the first material and then plating the etched sheet with the second material.

Figure 4:
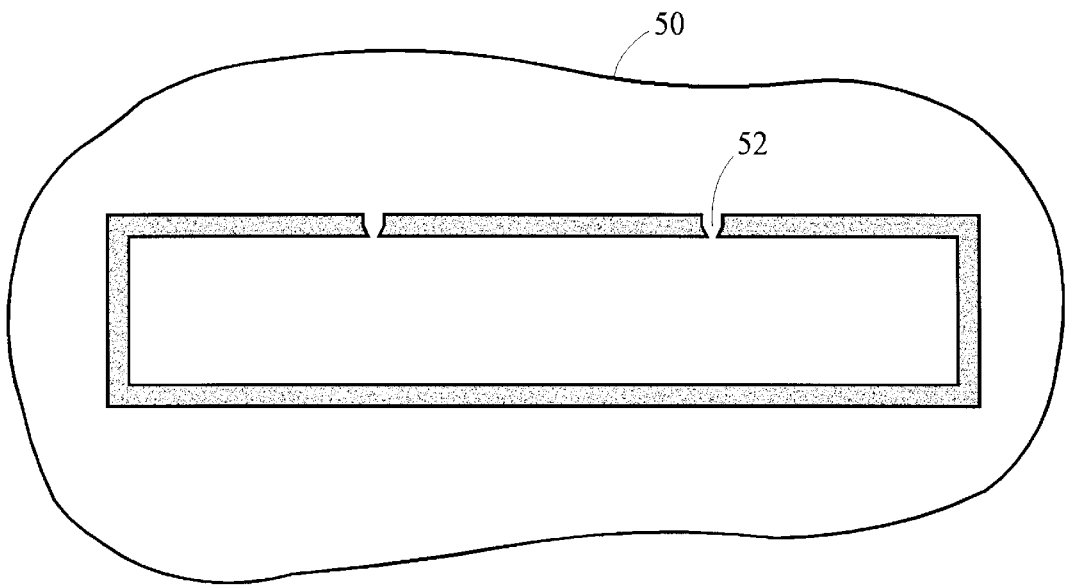
FIG. 4 is a schematic illustration of an electrical contact structure component that is etched in a sheet of material.
Figure 5:
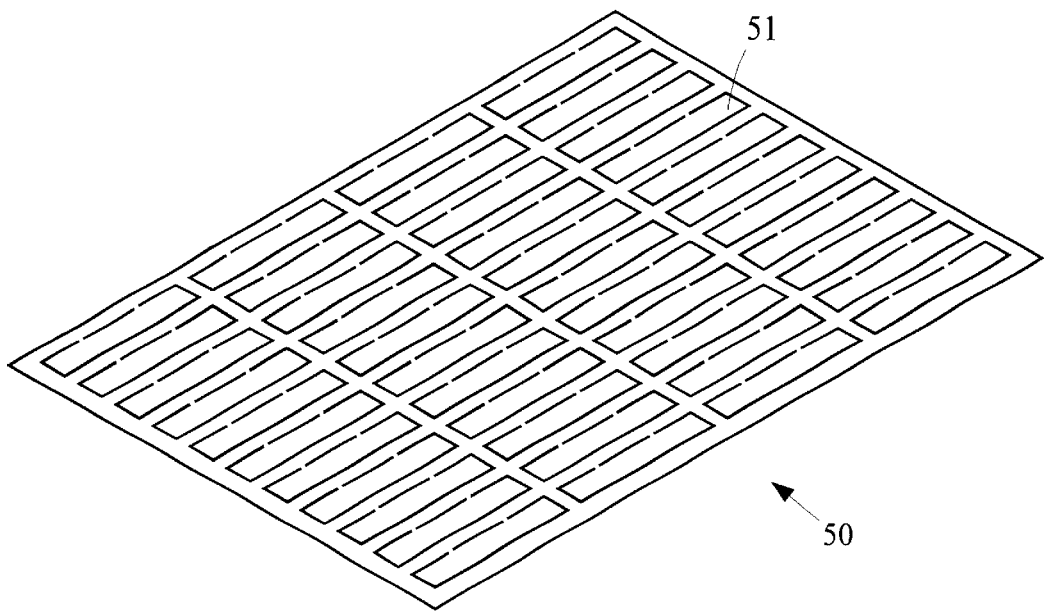
FIG. 5 is a schematic illustration of a plurality of electrical contact structure components that are etched in a sheet of material.

FIG. 4 is a schematic illustration of an electrical contact structure component 51 whose outline is etched in a sheet 50 of material. FIG. 5 is a schematic illustration of a sheet 50 of material in which a plurality of electrical contact structure components 51 have been etched. One or more legs 52 attach each component to the surrounding sheet. Preferably, each leg is etched with a shape that facilitates separating the components from the sheet. For example, this may be accomplished by narrowing the width of each leg at or near the edge of component, as shown in the figure.

Continuing the Cu/Mo/Cu example discussed above, electrical contact structures may be manufactured inexpensively by the following process:

1. Etch a sheet of molybdenum that is 0.0075 cm thick, removing material that defines the outline of each component. This may be accomplished in a variety of ways including chemical etching, ion milling and laser etching. If photoresistive masks are used, these mask should be removed after the etch is completed.
2. Plate the etched sheet with copper, controlling the plating process so that the plated thickness on each side is 0.00125 cm.
3. Separate a plated component from the sheet, thereby obtaining a finished electrical contact structure. This may be accomplished in a variety of ways such as by pulling a structure from the etched sheet to break the legs that attach the structure to the remaining sheet, or by cutting the legs using a laser or ion beam.

Alternative processes may be used in principle such as, for example, forming Mo components and plating the components individually.

After the electrical contact structure is formed, it may be desirable to metallize the contact structure, for example by sputtering a layer of nickel and gold onto the structure, before affixing it to a semiconductor laser using an agent such as a gold-tin solder.

What is claimed is:

1. A laser module comprising:
   a PN-junction semiconductor laser having a coefficient of thermal expansion (CTE) and having a P-side and an N-side; and
   a contact structure affixed by affixing means to a surface of the PN-junction semiconductor laser on either the P-side or the N-side, wherein the contact structure comprises;
      a first component comprised of a layer of a first material having a first CTE; and
      a second component comprised of a layer of plated with a second material having a second CTE plated on opposing surfaces of the first component, wherein the first and second components have an overall thickness such that the contact structure has an effective CTE that matches the CTE of the semiconductor laser more closely than either the second CTE or the first CTE; and wherein the layers of the second material are of substantially equal thickness to balance thermal stresses between the first component and the second component.

2. A laser module according to claim 1 that comprises:
   a plurality of semiconductor lasers affixed to a common substrate; and
   a plurality of contact structures, wherein a respective contact structure is affixed to the surface of a respective semiconductor laser.

3. A laser module according to claim 1 wherein the second material is copper, the first material is molybdenum, and the affixing means is a hard solder.

4. A laser module according to claim 3 wherein the second component has a thickness on each opposing surface that is within a range from about one-twentieth to about one-fifth of the contact structure thickness.

5. A laser module according to claim 3 wherein the the hard solder is a gold-tin solder.

6. A laser module according to claim 1 wherein the second material is silver, the first material is molybdenum and the affixing means is a hard solder.

7. A laser module according to claim 6 wherein the the hard solder is a gold-tin solder.

8. A laser module according to claim 1 wherein the contact structure is affixed to the N-side.

* * * * *

UNITED STATES PATENT AND TRADEMARK OFFICE
CERTIFICATE OF CORRECTION

PATENT NO.    : 6,674,775 B1
DATED         : January 6, 2004
INVENTOR(S)   : Dohle et al.

It is certified that error appears in the above-identified patent and that said Letters Patent is hereby corrected as shown below:

Column 3,
Line 32, "I except electrical" should read -- 1 except electrical --

Column 6,
Line 20, "a layer of plated with" should read -- a layer of --

Signed and Sealed this

Sixth Day of July, 2004

JON W. DUDAS
*Acting Director of the United States Patent and Trademark Office*